United States Patent
Kanayama (10) Patent No.: US 6,434,369 B1
(45) Date of Patent: Aug. 13, 2002

(54) ANTENNA DEVICE AND PORTABLE TRANSCEIVER

(75) Inventor: Yoshiki Kanayama, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/372,127

(22) Filed: Aug. 11, 1999

(30) Foreign Application Priority Data

Aug. 12, 1998 (JP) .............................................. 10-228196

(51) Int. Cl.7 ................................................. H04Q 7/20
(52) U.S. Cl. ........................... 455/90; 455/550; 343/895
(58) Field of Search ................................ 455/550, 562, 455/575, 90, 95, 100, 82; 379/328, 330, 329; 343/702, 700 MS, 701, 752, 713, 895, 905, 866, 906, 873

(56) References Cited

U.S. PATENT DOCUMENTS

| | | | |
|---|---|---|---|
| 4,577,195 A | 3/1986 | Schwanitz et al. | .......... 343/702 |
| 5,014,071 A | 5/1991 | King | |
| 5,581,268 A * | 12/1996 | Hirshfield | .................... 343/583 |
| 5,723,912 A | 3/1998 | Ahrabian et al. | .......... 360/10.5 |
| 5,777,587 A | 7/1998 | Tsuru et al. | ................. 343/752 |
| 5,894,292 A * | 4/1999 | Everest, III et al. | ......... 343/895 |
| 5,918,162 A * | 6/1999 | Ito et al. | ........................ 455/82 |
| 5,986,614 A * | 11/1999 | Suesada et al. | ............. 343/752 |
| 6,052,567 A * | 4/2000 | Ito et al. | ........................ 455/90 |
| 6,166,694 A * | 12/2000 | Ying | .......................... 343/702 |

FOREIGN PATENT DOCUMENTS

| | | | |
|---|---|---|---|
| DE | 4436157 | 4/1995 | |
| EP | 0645837 | 3/1995 | |
| EP | 10084216 | 3/1998 | .......... H01Q/11/08 |
| JP | 09135117 | 5/1997 | |
| JP | 10084216 | 5/1998 | |

* cited by examiner

Primary Examiner—Dwayne Bost
Assistant Examiner—Jean A Gelin
(74) Attorney, Agent, or Firm—Jay H. Maioli (57) ABSTRACT

An antenna device includes an electrically conductive wire having a predetermined length in which one end portion of the wire is mounted on one face of a circuit board, the other portion is wound spirally and extends in a direction perpendicular to the plane of the circuit board.

3 Claims, 6 Drawing Sheets

ANTENNA DEVICE AND PORTABLE TRANSCEIVER

BACKGROUND OF THE INVENTION

1. Field of the Invention

The present invention relates to an antenna device suitably applied to, for example, a portable telephone terminal or the like and a portable transceiver provided with this antenna device.

2. Description of the Related Art

Conventionally, as an antenna mounted in such a portable transceiver as a portable telephone terminal or the like, there is an antenna referred to as a helical antenna besides a so-called rod-shaped whip antenna. This helical antenna is an antenna configured by winding a wire in a coil shape and it can be built in an interior of the terminal. A helical antenna built in a conventional portable terminal has a configuration shown in FIG. 1, for example.

Figure 1:
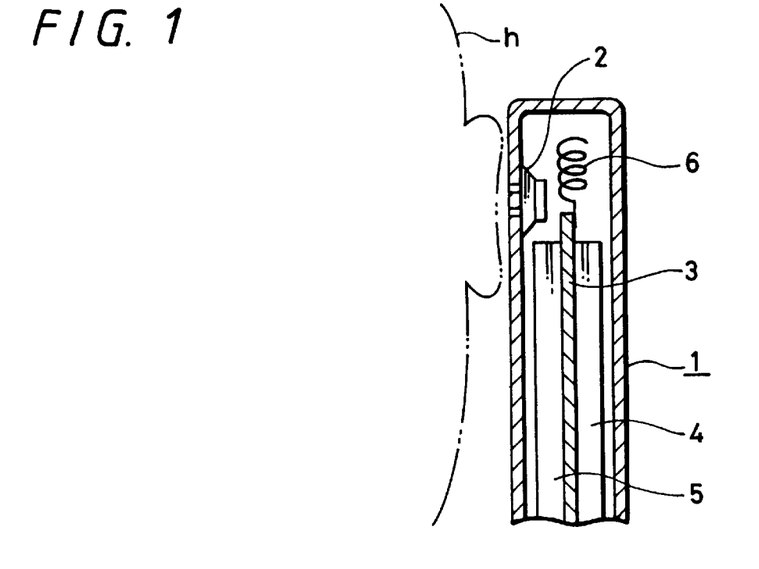
FIG. 1 is a sectional view showing a configuration of a conventional helical antenna built-in type terminal.

FIG. 1 is a cross-sectional view showing an interior of an upper portion of a portable terminal, and a terminal 1 configured by a predetermined casing is built-in at its upper portion with a speaker 2 for conversation and is built-in with a circuit board 3 assembled with a communication circuit for performing transmission processing and reception processing. Shield cases 4, 5 are disposed on both faces of the circuit board 3, so that the communication circuit assembled on the circuit board 3 is shielded from the outside. Also, one end of a helical antenna 6 formed by winding an electrically conductive wire in a coil shape is connected to an upper end portion of the circuit board 3 and the connected portion of the upper end portion is used as a power feed portion.

This helical antenna 6 has a winding direction extending upwardly, and it is configured as an antenna extending in a direction parallel to a plane of the circuit board 3.

In this conventional helical antenna, as shown in FIG. 1, since an open end side of the antenna approaches to the head h of a user of the portable terminal when this terminal is used, there is a problem that the antenna is apt to be affected by the human head and the characteristics of the antenna deteriorate, so that an excellent radio communication environment can not be obtained.

Also, when there is a ground pattern which is a ground potential portion in the vicinity of an antenna mounting portion of the circuit board where the helical antenna is mounted, the characteristics of the antenna remarkably deteriorate. Accordingly, the ground pattern can not be provided in the vicinity of the portion on which the antenna has been mounted, and therefore a circuit can not be assembled near the portion where the antenna is mounted. As a result, the occupancy area of the antenna-mounted portion on the area of the board becomes large, which results in prevention of reduction in size of a portable terminal.

Furthermore, as shown in FIG. 1, when the wire configuring the helical antenna is mounted on the circuit board, there has been a problem that the working efficiency for mounting thereof is poor. That is, helical antennas are generally fixed at their end portions to circuit boards by soldering or the like, and it is necessary to fix the helical antennas in a state where they are always oriented to a constant direction. However, there is a problem that, as the wires having a three-dimensional configuration such as the helical antenna are always fixed in the same state by soldering or the like, the working efficiency is not good.

SUMMARY OF THE INVENTION

An object of the present invention is to improve wireless characteristics of a transceiver using a helical antenna and a working efficiency at a time of mounting an antenna.

According to an aspect of the present invention there is provided an antenna device which comprises a helical antenna composed of a conductive wire having a predetermined length one end portion of which is attached to one side face of a circuit board, the other portion of which is wound spirally, and an extending direction of which by the winding is perpendicular to a plane of the circuit board.

According to the present invention, a direction in which the wire configuring an antenna is wound to extend becomes a direction perpendicular to the plane of the circuit board. When a transceiver equipped with this antenna is used, the open end side of the antenna can be oriented in a direction in which the antenna goes away from the head of a user.

DESCRIPTION OF THE PREFERRED EMBODIMENTS

The present invention is applied to a portable transceiver serving as a portable telephone terminal which performs radio communication with a base station for radio telephone or the like via predetermined radio telephone lines so that radio telephone conversation by transmission of sound data and/or various data communication can be conducted.

Figure 2:
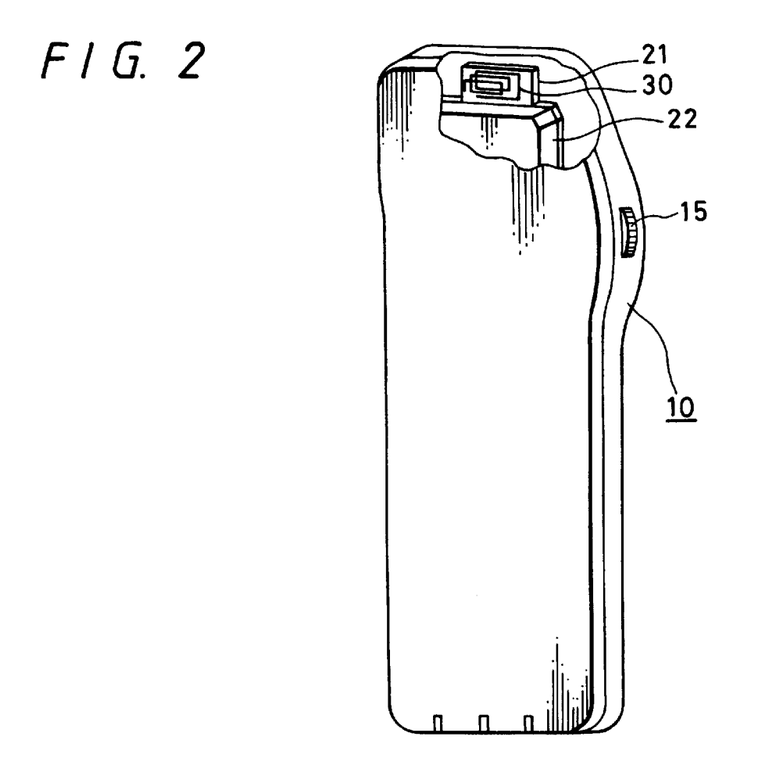
FIG. 2 is a perspective view showing a back face side of a portable radio terminal according to an embodiment of the present invention with a part being cut away.
Figure 3:
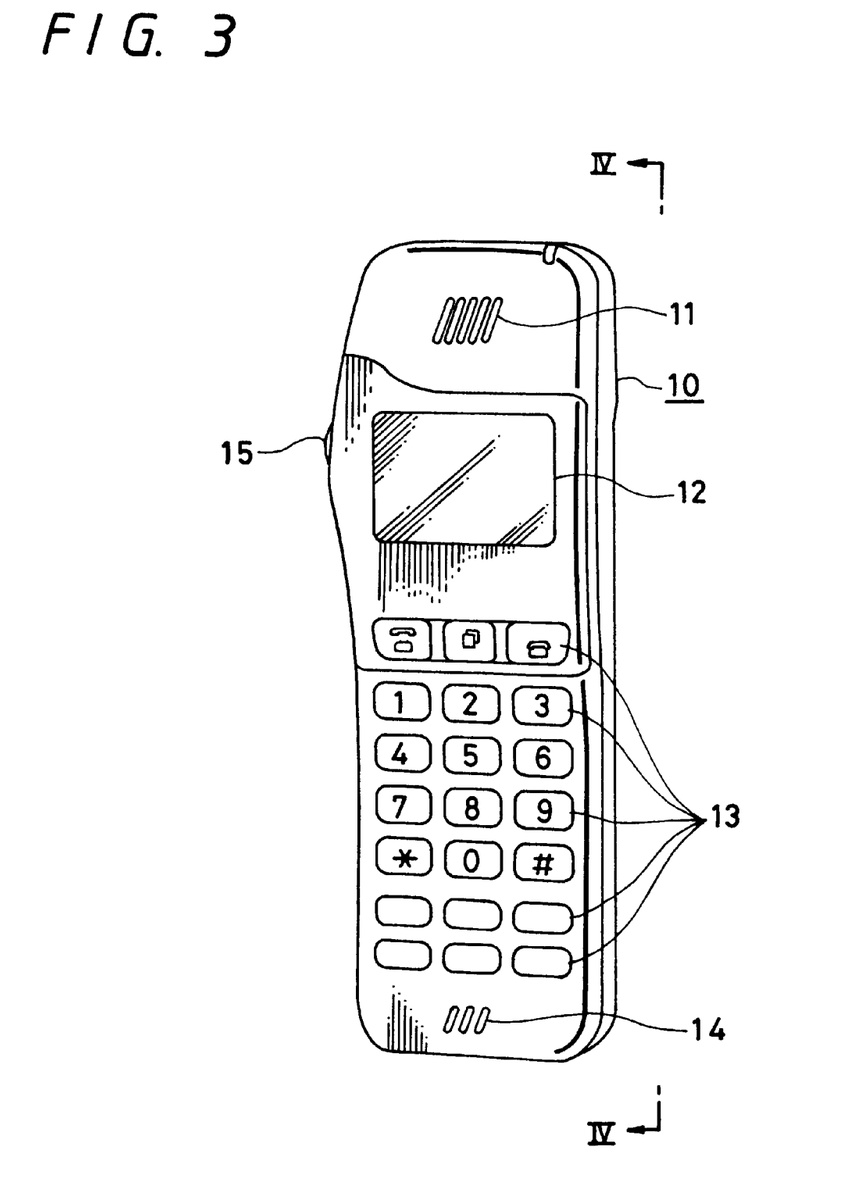
FIG. 3 is a perspective view showing a front face side of the portable radio terminal according to the embodiment of the present invention.

FIG. 2 and FIG. 3 shows a back side and a front side of a portable radio terminal of this embodiment. The front side shown in FIG. 3 will first be explained. A speaker 11, a display panel 12, an operation key 13, and a microphone 14 are disposed on the front side of a casing configuring the radio terminal 10 in this order from the upper side. The speaker 11 and the microphone 14 are used at a time of telephone conversation and processings for emanating the voice received of a communication mate from the speaker 11 and for transmitting the voice picked up by the microphone 14 to the communication mate are performed by an internal circuit (not shown) of the portable radio terminal 10.

As the operation key 13, a plurality of keys such as keys for setting various functions are provided besides such dial keys as numerals, symbols or the like. Various information such as a telephone number, a character message or the like is displayed on the display panel 12 on the basis of operations of the keys 13. Also, the portable radio terminal 10 of this embodiment is provided on a side face of the casing with a rotating type switch 15 which is a rotary type switch called a jog dial which allows rotating operation and pushing-down operation. The portable radio terminal is configured such that the various operations can be effected even by operations of this rotating type switch 15.

Figure 5:
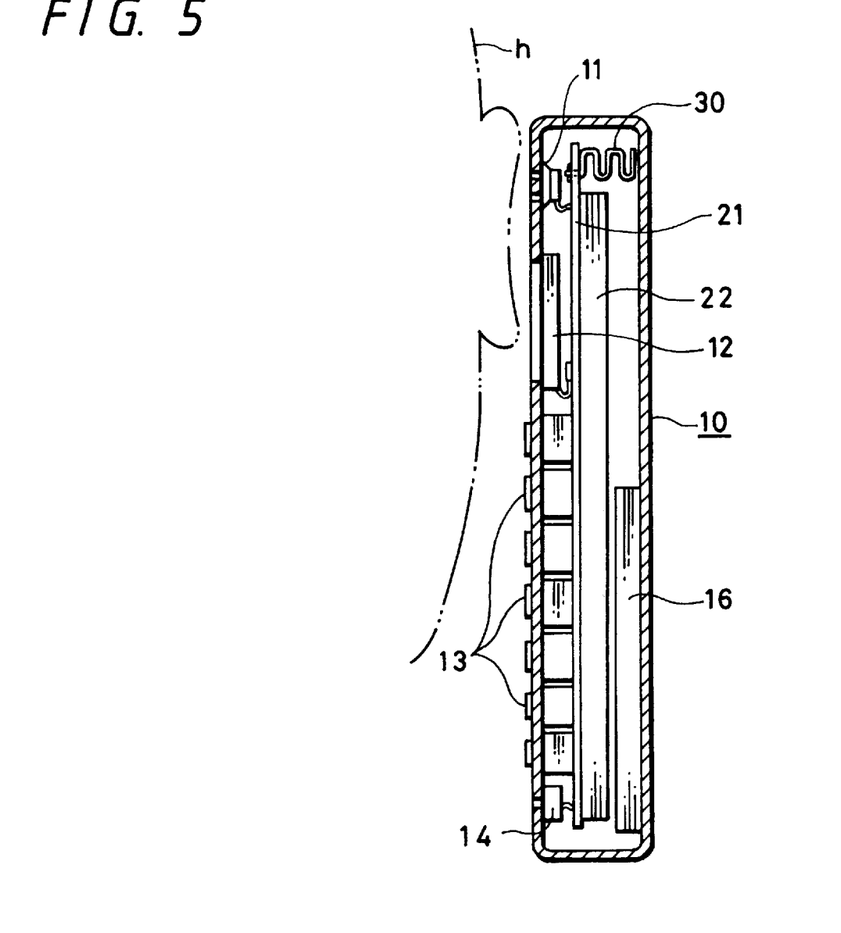
FIG. 5 is a sectional view taken along the line IV—IV in FIG. 3.

As an interior of the portable radio terminal 10 of the embodiment is shown in FIG. 5, a plane circuit board 21 is disposed in the portable radio terminal, circuit parts configuring a communication circuit are mounted on the circuit board 21, and the entire communication circuit is covered with a shield case 22. However, an upper end portion of the back side face of the circuit board 21 is not covered with the shield case 22. Also, FIG. 5 shows a state where the shield case 22 is provided on only one side face (a face faced to a back side of the terminal) of the circuit board 21, but the circuit parts configuring the communication circuit are mounted on both faces of the circuit board 21 and the shield cases are attached to both faces of the circuit board 21. In the following explanation, the front face of the circuit board 21 shows a face opposed to the front face (shown in FIG. 3) of the terminal 10 and the back face of the circuit board 21 shows a face opposed to the back face (shown in FIG. 2) of the terminal 10.

Also, the speaker 11, the display panel 12, and the microphone 14 are connected to the circuit board 21 and switches are disposed at positions of the circuit board 21 corresponding to the respective operation keys 13. When each of the operation keys 13 is pushed, the corresponding switch is turned on so that the operation information is sent to a control unit of the terminal. This control unit is configured with a microcomputer (not shown) attached to the circuit board 21. As shown in FIG. 5, a battery 16 configured with a secondary cell is disposed at a lower portion of the casing, and the power supply from the battery 16 is supplied to the circuits assembled on the circuit board 21.

As an antenna (an antenna has both transmitting and receiving functions herein) provided in the portable radio terminal 10, a helical antenna 30 which is built in the casing configuring the terminal 10 and which is constituted by winding a conductive wire such a copper wire or the like is used. This helical antenna 30 is attached to an upper end portion (the portion on which the above-mentioned shield case 22 is not disposed) of the circuit board 21 disposed in the casing configuring the portable radio terminal 10, as shown in FIG. 2 and FIG. 5. The helical antenna is attached to the circuit board 21 so as to project to the back face side of the circuit board 21. Here, as shown in FIG. 5, the helical antenna 30 is disposed via the circuit board 21 at a position opposed to a position where the speaker 11 is disposed.

Figure 4:
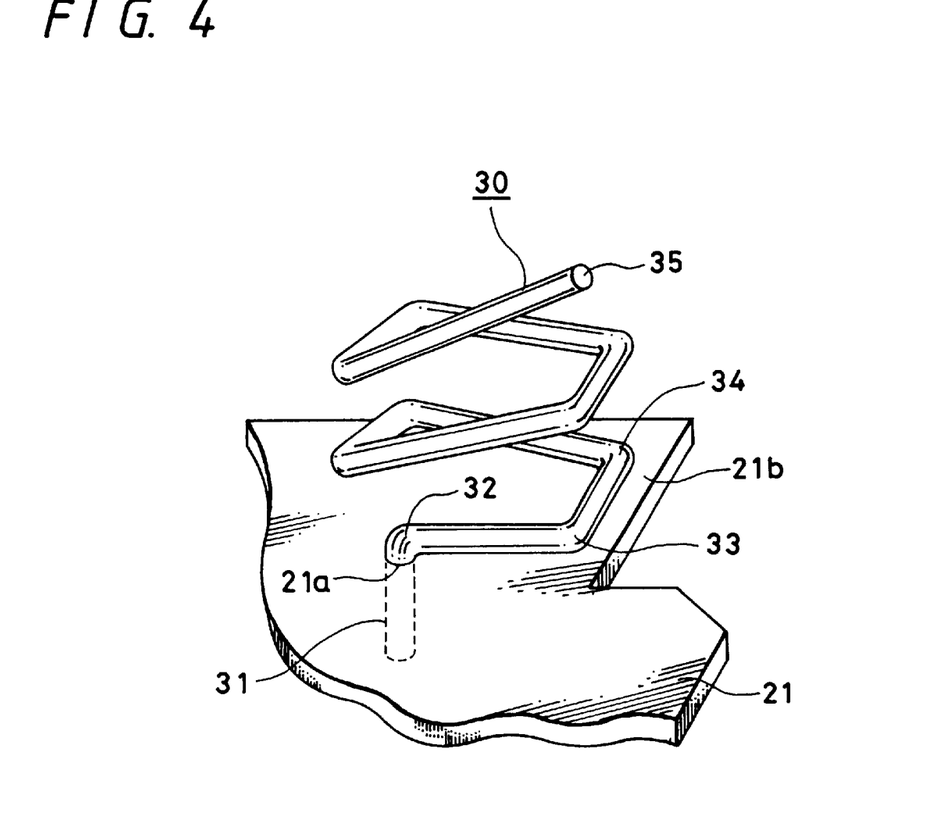
FIG. 4 is a perspective view showing an antenna portion according to the embodiment of the present invention with an enlarged scale.
Figure 6:
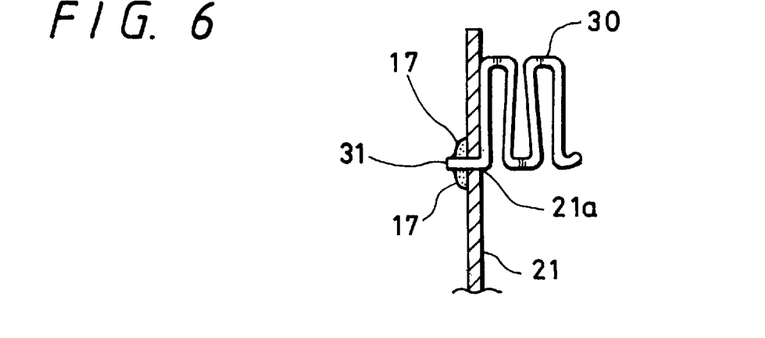
FIG. 6 is a sectional view showing a main portion in FIG. 5 with an enlarged scale.

FIG. 4 is a view showing a state where the helical antenna 30 is mounted on the back face of the circuit board 21 with an enlarged scale. A through hole 21a is provided on the upper portion of the circuit board 21 which is not covered with the shield case, and one end portion 31 of a wire configuring the helical antenna 30 is inserted into the through hole 21a from the back face side of the circuit board 21. Then, as shown with an enlarged scale of a section of the antenna-mounting portion in FIG. 6, the one end portion 31 is soldering-fixed on the front face side of the circuit board 21 with a solder 17, and it is electrically connected to an antenna connecting portion (a power feed portion) of a circuit formed on the circuit board 21 by soldering. It is to be noted that a through hole plating processing is applied to a wall face of the through hole 21a and soldering-fixing can be performed even on the inner side of the through hole 21a and the back face side thereof so that the area of the soldering can be enlarged.

As the shape of the helical antenna 30, as shown in FIG. 4, the wire configuring the antenna 30 has a square and helical shape where it is bent at about 90° at every predetermined length and it is wound so as to be apart from the back face of the board 21. Namely, a direction in which the wire configuring the antenna 30 extends by its winding is set to be a direction perpendicular to a plane of the circuit board 21. As to the practical size of the square shape, it is set to be a size where signal of a frequency band transmitted/received by the terminal 10 can be transmitted/received favorably.

In this case, the antenna 30 has a shape where it contacts with a back face 21b of the circuit board 21 at its portion going from one end portion 31 inserted in the through hole 21a followed by a bending point 32 bent first at about 90° via the next bending point 33 to the next but one bending point 34, and the antenna 30 is wound in a shape where it gradually leaves from the circuit board 21 from the bending point 34. Then, the other end portion 35 which is an open end of the antenna is put in a state where it is farthest from a plane configured by the circuit board 21. It may be appreciated that any portion of the portion of the antenna contacting with the circuit board 21 from the bending point 32 to the bending point 34 is soldered to the back face 21b of the circuit board 21, thereby securing the fixation of the antenna further.

The helical antenna 30 thus configured which is attached to the portable radio terminal 10 can obtain an excellent radio characteristic. That is, as shown in FIG. 5, the head h of a user is put in a state where it is closer to the front side of the terminal 10 when the portable radio terminal 10 is actually used. However, since the open end of the helical antenna 30 has a shape where it is apart from the head, the helical antenna is hard to be affected from the head of a human body and it is possible to suppress a degradation amount of the antenna characteristic due to the influence of the head of the human body, so that an excellent radio environment can be obtained.

Also, as the open end (the other end 35 shown in FIG. 4) of the helical antenna 30 is put in a position where it is apart from the circuit board 21 and the advancing direction which occurs by winding of the helical antenna 30 is a direction where the helical antenna is perpendicularly apart from the plane configured by the circuit board 21, the characteristic of the helical antenna 30 does not deteriorate even if a ground pattern is provided in the vicinity of a portion where the helical antenna is attached to the circuit board 21 and circuit parts are practically mounted on the circuit board 21. Accordingly, it becomes possible to practically mount the circuit parts on the circuit board 21 even near the antenna-mounting portion, and it is made possible to practically mount the circuit parts on the circuit board 21 with a high density, which results in down-sizing of the portable radio terminal 10. However, it is necessary to separate the power feed portion of the antenna and the ground pattern from each other when the circuit pattern is provided on the circuit board 21.

Furthermore, in this embodiment, a working efficiency for mounting the wire configuring the helical antenna 30 is improved. In other words, as shown in FIG. 4, in a state where the one end portion 31 of the helical antenna 30 is inserted into the through hole 21a of the circuit board 21 up to the bending point 32 and the portion of the helical antenna comes in contact with the board from the bending point 32 to the bending point 34, the helical antenna can be fixed to the circuit board only by soldering. At this time, the antenna 30 of a state before the one end portion of the helical antenna is inserted into the through hole 21a and the soldering is effected is put in a state where the helical antenna is pivotable about the one end portion 31 as an axis. Therefore, after the antenna is set at a proper position by pivoting, it is confirmed that the portion of the antenna from the bending point 32 to the bending point 34 contacts with the board, and then the antenna can be fixed to the board by soldering, so that the antennas can always be assembled at a constant state. At this time, for example, the antenna may be positioned by using a jig.

Figure 7:
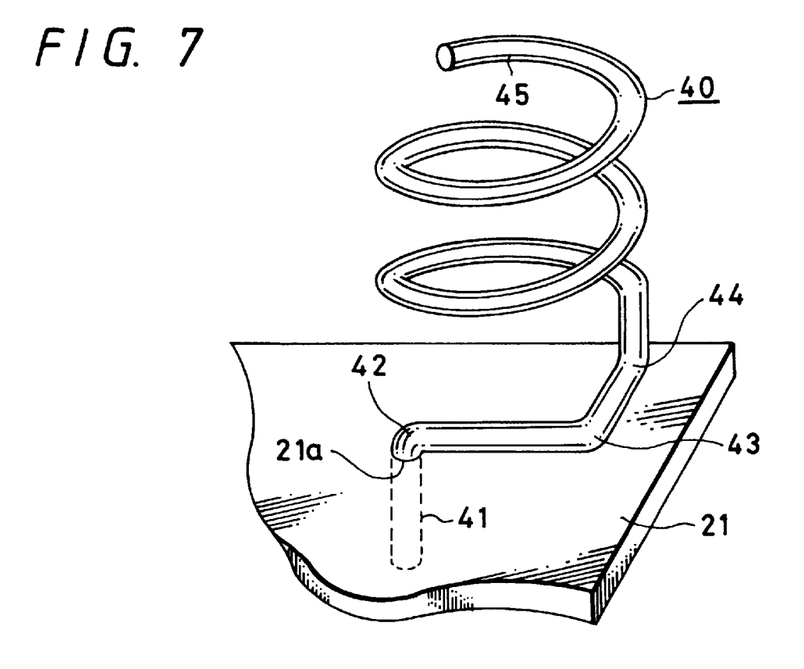
FIG. 7 is a perspective view showing a configuration of an antenna portion according to another embodiment of the present invention.

In the above-described embodiment, the helical antenna which has been wound spirally and in a square shape is explained as an example, but a helical antenna 40 can be configured by winding a wire in a circular and helical shape as shown in, for example, FIG. 7. In this case, also, the circuit board 21 is provided with a through hole 21a, one end portion 41 of the helical antenna 40 is inserted into the through hole 21a from the back face of the circuit board 21, and the helical antenna is soldered to the circuit board. The wire is bent by about 90° at bending points 42, 43, 44. This configuration of the helical antenna is the same as that of the helical antenna 30 described above. That is, it is configured so as to be wound from bending point 42 to bending point 44 in circular. Also, the helical antenna is set such that it contacts with the board 21 in a range of the bending point 42 to the bending point 44. According to this configuration, the radio characteristic which is not affected by the head of a user can be obtained like the case of the square helical antenna mentioned above, and the working efficiency for mounting can also be made excellent like the square helical antenna described above.

Figure 8:
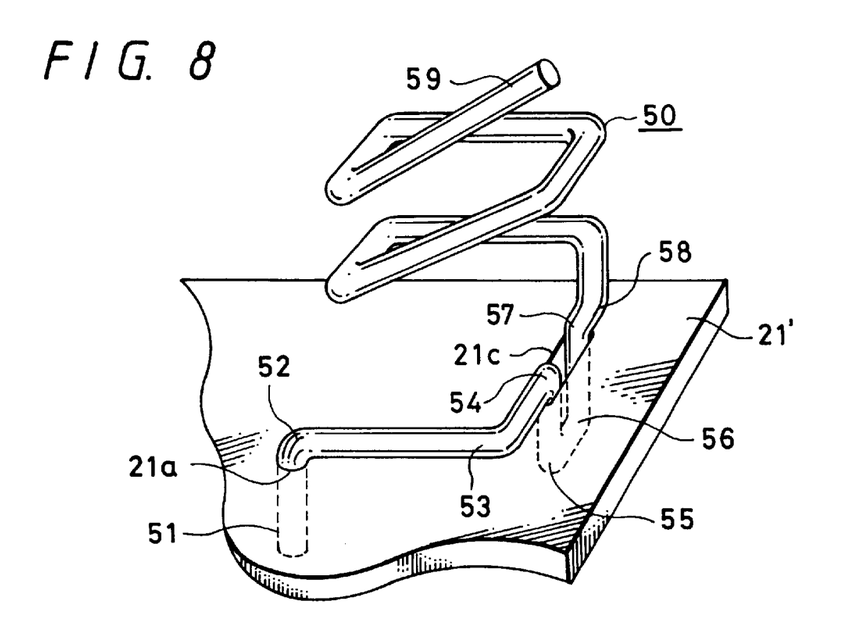
FIG. 8 is a perspective view showing a configuration of an antenna portion according to another embodiment of the present invention.

Also, a helical antenna can be configured such that a portion of a wire configuring the helical antenna is wound in a convex shape, the convex portion thereof is engaged with a through hole or a recessed portion of the circuit board, and a soldering position thereof may be defined. Namely, for example, as shown in FIG. 8, a circuit board 21' is provided with a through hole 21a and a slit-like through hole 21c. As a helical antenna 50, one end portion 51 is inserted into the through hole 21a and the wire contacts with the back face of the circuit board 21 in a range of a bending point 52 which has bent by about 90° to the one end portion 51 to the next bending point 53, and the wire is provided at a portion which is slightly apart from a position bent by about 9020 at the bending point 53 with bending points 54, 55, 56, 57 bent in a convex shape projecting toward the board and the portion projecting in the convex shape is fitted into the slit-like through hole 21c of the circuit board 21'. Then, as a position which is slightly apart from the bending point 57 is set as a bending point 58, the wire is bent at the bending point 58 so as to be apart from the front face of the circuit board 21' and is wound up to an open end 59. Thus, the wire is configured as the helical antenna.

As the helical antenna is configured as shown in FIG. 8, the helical antenna 50 is positioned to the circuit board only by inserting the one end portion 51 of the helical antenna 50 into the through hole 21a of the circuit board 21' and fitting the convex-shaped bent portion into the through hole 21c, and in this state the helical antenna is fixed to the circuit board at the through hole 21a or the like by soldering, so that work for fixing the helical antenna to the circuit board can always be carried out in a constant positional relationship without using a jig. When a thick board is used as the circuit board, the present invention can be configured such that a portion recessed in a concave shape is provided in the circuit board instead of the through hole 21c fitted with the convex-shaped bent portion, and the concave-shaped bent portion of the antenna is fitted into the recessed portion. Also, in this embodiment, the winding shape of the wire serving as the helical antenna can be configured in a circular shape besides the square shape shown in FIG. 8.

Figure 9:
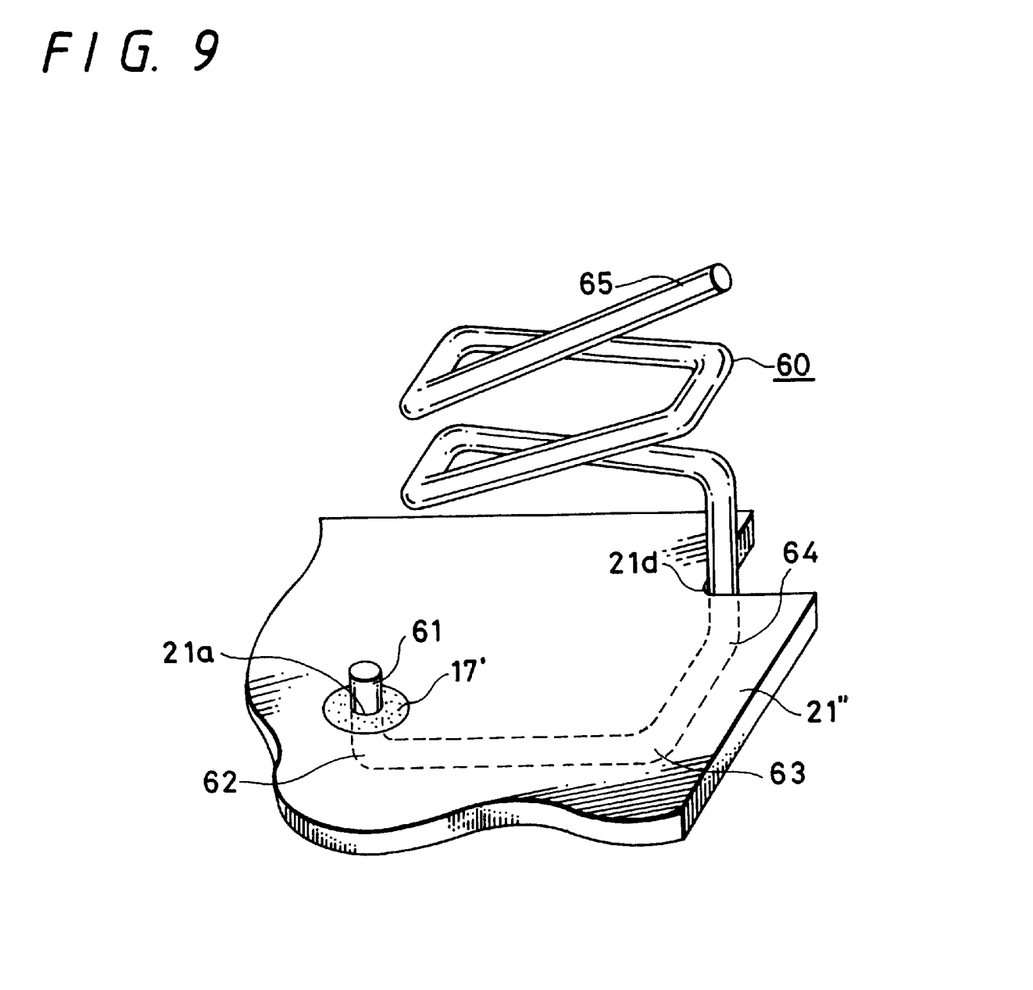
FIG. 9 is a perspective view showing a configuration of an antenna portion according to still another embodiment of the present invention.

Also, when the helical antenna is mounted on the circuit board, it may be possible that the wire is inserted into the through hole from the front side of the circuit board, the wire inserted in the front side is extended up to the back face thereof and the extended portion is wound to be the helical antenna. That is, as shown in FIG. 9, for example, one end portion 61 of a helical antenna 60 is inserted into a through hole 21a provided through a circuit board 21" from the front side (a lower side in FIG. 9) of the circuit board, 21" and the one end portion is soldered by solder 17' on the back side (an upper side in Figure) of the circuit board 21". Then, the wire projecting to the front side of the through hole 21a is bent by about 90° at a bending point 61, it is brought into contact with a plane of the board along the front face of the circuit board 21", and it is bent by about 90° at a bending point 63. Thereafter, the wire is further bent towards the back side of the circuit board 21" at another bending point 64, it is projected to the back face side via a cut-off portion 21d of the circuit board 21", and the wire projected to the back face side is wound up in a square shape (or circular shape) up to an open end 65, so that the wire is configured so as to serve as a helical antenna 60.

Since the helical antenna 60 is configured as shown in FIG. 9, the helical antenna 60 is necessarily positioned at two positions of the through hole 21a and the cut-off portion 21d, work for fixing the helical antenna can always be performed in a constant positional relationship without using a jig like the embodiment shown in FIG. 8.

Furthermore, with a shape other than the shapes shown in FIG. 4 or FIG. 7, FIG. 8 and FIG. 9, a wire configuring a helical antenna may be fixed to the circuit board. In this case, if the antenna is configured such that at least one end portion of an antenna is inserted in a through hole, and a portion of the antenna except for the at least one end portion contacts with the circuit board at a plurality of places, the position of the antenna at a time of mounting the antenna is positioned like the above-mentioned embodiments, so that the effect similar to each of the above embodiments can be obtained.

In the above-mentioned embodiments, the helical antenna mounted on the circuit board is used as an antenna for both transmission and reception of a portable radio terminal, but the present invention can be configured such that another antenna such as a whip antenna is mounted on a portable radio terminal and diversity reception is performed by two antennas of the antenna and the helical antenna mounted on the circuit board. Alternatively, the present invention may be configured such that two helical antennas are mounted on different positions of the circuit board and diversity reception is performed by the two helical antennas.

Also, in the above-mentioned embodiments, the helical antenna is mounted on the circuit board inside the radio terminal serving as a portable telephone terminal, but the present invention is, of course, applicable to a case where various transceivers are configured as antenna devices each having a helical antenna mounted inside a circuit board.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. An antenna device mounted on a flat circuit board, comprising:

an electrically conductive wire of a predetermined length having an end portion attached to a surface of the circuit board and laying substantially flat thereon, and a remaining portion wound spirally and extending in a direction perpendicular to the face of the circuit board, wherein the surface of the circuit board includes a substantially rectangular slot and a through hole formed thereon, and a U-shaped portion is formed on the end portion of the wire to fit the rectangular slot and a right-angled portion is formed on the end portion of the wire to fit the through hole, thereby facilitating an alignment of the antenna on the circuit board.

2. A portable transceiver with a radio communication circuit built in a casing, comprising:

a flat circuit board built in the casing; and a helical antenna formed from an electrically conductive wire of a predetermined length having an end portion attached to a surface of the circuit board and laying substantially flat thereon, and a remaining portion wound spirally and extending in a direction perpendicular to the face of the circuit board, wherein the surface of the circuit board includes a substantially rectangular slot and a through hole formed thereon, and a U-shaped portion is formed on the end portion of the wire to fit the rectangular slot and a right-angled portion is formed on the end portion of the wire to fit the through hole, thereby facilitating an alignment of the antenna on the circuit board.

3. The portable transceiver according to claim 2, wherein a speaker and a microphone for conversation communication are disposed on a front face of the casing, and the helical antenna is disposed on a back side of the casing.

* * * * *